(12) United States Patent
Khakwani et al.

(10) Patent No.: US 10,832,152 B2
(45) Date of Patent: Nov. 10, 2020

(54) WET WELL PREDICTION USING REAL TIME DATA

(71) Applicant: Saudi Arabian Oil Company, Dhahran (SA)

(72) Inventors: Muhammad Shehryar Khakwani, Dhahran (SA); Abbas Wasel Albeshri, Dammam (SA); Abdullah Hamed Bar, Dammam (SA)

(73) Assignee: Saudi Arabian Oil Company, Dhahran (SA)

( * ) Notice: Subject to any disclaimer, the term of this patent is extended or adjusted under 35 U.S.C. 154(b) by 472 days.

(21) Appl. No.: 15/826,240

(22) Filed: Nov. 29, 2017

(65) Prior Publication Data
US 2019/0164073 A1    May 30, 2019

(51) Int. Cl.
*G06N 7/00* (2006.01)
*E21B 41/00* (2006.01)
(Continued)

(52) U.S. Cl.
CPC ......... *G06N 7/005* (2013.01); *E21B 41/0092* (2013.01); *G06N 20/00* (2019.01);
(Continued)

(58) Field of Classification Search
None
See application file for complete search history.

(56) References Cited

U.S. PATENT DOCUMENTS 6,056,781 A    5/2000  Wassick et al.
6,968,303 B1   11/2005 Wang et al.
(Continued)

FOREIGN PATENT DOCUMENTS

WO    2008104750 A1   9/2008
WO    2016033355 A1   3/2016

OTHER PUBLICATIONS

Qing, Yang et al., "A Generalized Predictive Control for Management of an Intelligent Well's Downhole, Interval Control Valves—Design and Practical Implementation", Sep. 8-11, 2009, SPE Offshore Europe Oil & Gas Conference & Exhibition, Society of Petroleum Engineers. (Year: 2009).*

(Continued)

*Primary Examiner* — Cedric Johnson
(74) *Attorney, Agent, or Firm* — Bracewell LLP; Constance G. Rhebergen; Ryan B. McBeth

(57) ABSTRACT

Embodiments of systems and methods for predicting when a dry oil producing well is expected to transition to a wet oil producing well, the system configured to generate predictions from multiple databases of information. A first database is designed to store real time data about an active producing well and a second database can be a historical production information database, such as an Online Transactions Processing (OLTP) database. The data from both databases can be normalized, compared, and correlated to create a predictive model that accurately predicts when a particular well is expected to transition from a dry oil producing well to a wet oil producing well. The system and method can be configured to use many different techniques including an autoregressive integrated moving average equation to create a predictive model based off the normalized data from the multiple databases.

18 Claims, 2 Drawing Sheets

(51) Int. Cl.

| | |
|---|---|
| *G06N 20/00* | (2019.01) |
| *G06Q 10/06* | (2012.01) |
| G06Q 50/06 | (2012.01) |
| E21B 47/10 | (2012.01) |
| E21B 47/06 | (2012.01) |
| E21B 49/08 | (2006.01) |
| E21B 47/07 | (2012.01) |
| G06F 30/00 | (2020.01) |

(52) U.S. Cl.
CPC ............ *G06Q 10/067* (2013.01); *E21B 47/06* (2013.01); *E21B 47/07* (2020.05); *E21B 47/10* (2013.01); *E21B 49/08* (2013.01); *E21B 49/0875* (2020.05); *G06F 30/00* (2020.01); *G06Q 50/06* (2013.01)

(56) References Cited

U.S. PATENT DOCUMENTS

| | | | |
|---|---|---|---|
| 8,103,493 B2 | 1/2012 | Sagert et al. | |
| 9,141,920 B2 | 9/2015 | Dunne et al. | |
| 2014/0039860 A1 | 2/2014 | Carvajal et al. | |
| 2014/0249876 A1* | 9/2014 | Wu ........................ | G05B 15/02 705/7.12 |
| 2015/0051892 A1 | 2/2015 | Carvajal et al. | |
| 2015/0213358 A1 | 7/2015 | Shelton et al. | |
| 2015/0276978 A1 | 10/2015 | Dupuy et al. | |
| 2016/0145976 A1 | 5/2016 | Walters et al. | |

OTHER PUBLICATIONS

Olominu, Oluwafemi et al., "Application of Time Series Analysis to Predict Reservoir Production Performance", Aug. 5-7, 2014, Nigeria Annual International Conference and Exhibition, Society of Petroleum Engineers. (Year: 2014).*

Muda, Nazuha et al., "Malaysia Crude Oil Production Estimation: An Application of ARIMA Model", Dec. 5-7, 2010, International Conference on Science and Social Research (CSSR 2010), IEEE. (Year: 2010).*

Bondar et al., "Analysis and Interpretation of Water-Oil-Ratio Performance", SPE Annual Technical Conference and Exhibition held in San Antonio Texas, 2002, pp. 1-19, Society of Petroleum Engineers.

The International Search Report and Written Opinion for related PCT application PCT/US2018/058544 dated Dec. 21, 2018.

Hu, Ta-Yin, and Wei-Ming Ho. "Travel Time Prediction for Urban Networks: The Comparisons of Simulation-Based and Time-Series Models." 17th ITS World Congress. 2010. (pp. 1-11).

SABP-A-059 Sampling Crude Oil for BS&W and Salt, dated Apr. 26, 2015.

* cited by examiner

WET WELL PREDICTION USING REAL TIME DATA

BACKGROUND

Field

Embodiments of the present disclosure relate to predicting when a dry oil producing well is expected to transition to a wet oil producing well.

Description of the Related Art

Software that tracks various statistics related to oil and gas production at well sites and stores the statistics in databases has been known for some time. Sensors may be used to detect various properties of produced oil & gas at various points in a production system. In modern production systems, the data recorded by such sensors can be logged to an onsite computer system and/or micro-computer system or the data may be logged over a network to offsite computer systems for later processing and analysis. Often times this data is loaded into a database with time logs associated with each sensor read, and information about the specific well and wellsite the data originated from.

There is a present need in the well industry for advanced prediction methods that can reliably and accurately predict when a dry oil producing well is expected to transition to a wet oil producing well. Embodiments of the present disclosure aim to provide advanced prediction methods and techniques and relate to cataloguing and analyzing real-time sensor data along with historical data in two separate databases, combining the data and using the data to predict when a dry oil producing well is expected to transition to a wet oil producing well.

SUMMARY

Embodiments of the present disclosure aim to provide advanced prediction methods and techniques to identify and predict when a dry oil producing well is expected to transition to a wet oil producing well. In an embodiment, real-time sensor readings for dry oil producing wells (wells producing oil with water content below a certain threshold) are input and analyzed and predictions are made about which wells are expected to transition to wet oil production. Wet wells are often characterized by the fact that their produced water content is greater than one-percent. In order for a well to be declared wet oil producing, a common test is for a well to have its fluid composition tested for three consecutive tests, showing the well as having water content or alternatively, high salt content. These tests are often conducted in laboratories using samples from the wells being tested. Salt content is also an indication of the presence of water because saline water is the manner in which the fluid produced from a well might contain salt. Normally testing is accomplished over a duration of several months. This testing and understanding of the transition time period is important because dry oil production systems and wet oil production systems are set up differently in order to achieve maximum efficiency in the production of oil at a particular wellsite.

Sensors are often installed in upstream oil and gas assets to monitor the flow of a well. These sensors can be installed at the surface, on the wellhead, and/or subsurface inside a well and may be installed along the main or mother bore. The sensors transmit data related to the flow rate of the fluid, the different phases of the fluids, the temperature of the fluids, the pressure, the vibrations of mechanical devices connected to the well, and many other readings depending on the configuration of sensors at a particular well site. These readings are received in real-time and stored in a database designed to store real-time data quickly and efficiently and provide access to the stored information such that the status of a well can be determined by an end user.

In some embodiments, the database that is configured to store the real-time data is also configured to monitor the state of the well and alert users as needed. Alternatively, a separate system with access to the database can be configured to monitor the state of the well and alert users as needed. If a well goes offline unexpectedly or if other pre-configured alert conditions are triggered, the user of the system can be alerted based on the real-time data that is streaming in and being logged in the database. The database is configured specifically to handle real-time data being conveyed by the sensors at the well. Notably, this type of database is configured in a different manner than an online transaction processing database (OLTP) that stores different information about the upstream assets. An OLTP database is configured to store information about the wells including their age, the production history, the type of completion, and the various geochemical tests conducted on the fluid samples taken from the wells. This is similar to the information considered in the traditional method for conducting surveys, sampling and recording test results.

Embodiments take the new and current data from the real-time database, combine it with data from a traditional database, such as an OLTP database, and after processing, analyzing, and/or correlating data from both sources, creates a prediction when a dry well will transition into a wet well. In an embodiment, the system can be configured to analyze the data from both data stores simultaneously and based on comparisons and correlations, produce a predictive model for when a well will become wet and have water content over one-percent. In an embodiment, the system can also look for patterns in real-time data and give insight into the quality of the data. For example, there may be spikes in the data at times that may be inaccurate and in an embodiment the system can be configured to filter out any such noise to ensure accurate predictions by the system.

In an embodiment, the system for predicting when a particular well is expected to transition from a dry oil producing well to a wet oil producing well is configured to receive data from an OLTP database and a real-time database, combing the data sets, removing outlier sensor reading, converting the combined data set to a time series, building a model, and then predicting the wet well based on the predictive model. In some embodiments, the model is an autoregressive integrated moving average model (ARIMA) and uses both data sets to analyze and identify candidate wells to predict if and when wells are going to become wet oil production wells so that they can be identified and the well managers and services can be alerted and plan accordingly for the transition.

According to an embodiment, the system can be configured to perform a method for predicting when a dry oil producing well is expected to transition to a wet oil producing well, the method comprising the steps of gathering and storing real-time data from at least one well relating to water cut and storing it in real-time in a database configured to store real-time data; gathering and storing historical online transaction processing data from the at least one well and storing the historical online transaction processing data in an online transaction processing database; combining and normalizing the real-time and online transaction processing data from both databases; removing outliers from the combined and normalized data; converting the combined data to time series data; building a predictive model using an autoregressive integrated moving average for the at least one well that predicts when the at least one well will be producing hydrocarbons with water content greater than one percent based on the converted data; and identifying whether the at least one well should be further tested for water and determining when the well will change from dry to wet based on the predictive model.

In an embodiment the method can comprise the step of comparing and correlating the historical online transaction processing data and the real-time data from each of the online transaction processing database and real-time database, respectively, using machine learning.

In an embodiment the method can comprise the step of detecting data updates in each of the online transaction processing database and real-time database and building a predictive model based off these data updates.

In an embodiment the method can comprise the step of taking readings in real time at meters installed at the surface, on the wellhead, and inside the well head at the main or mother bore of the wells relating to flow rate of the fluid, the different phases of fluid, the temperature, the pressure, and vibrations of mechanical devices.

In an embodiment the method can comprise the step of monitoring the real-time data database and raising a flag if a well goes offline unexpectedly or if it is under-producing.

In an embodiment the system can be configured such that the online transaction processing database includes database fields for information about wells, their age, the production history, type of completion, and various geochemical tests conducted in fluid samples taken from the wells.

In an embodiment the method can comprise the step of analyzing and processing data in the real-time database to identify patterns in the real-time data and processing data in the real-time database to smooth out noise and disqualify apparent bad signals.

In an embodiment the method can comprise the step of scheduling geochemical testing according to an automatic decision based on the predictive model generated.

In an embodiment the method can comprise the step of displaying to a user on a display the status of each well and the predictive models.

According to an embodiment, a system for predicting when a dry oil producing well is expected to transition to a wet oil producing well, the system can be comprised of the following: a real-time database configured to store real-time data from at least one well relating to water cut; an online transaction processing database configured to gather and store historical data from the at least one well; a computer system configured with a processor and memory, the computer configured to combine and normalize data from the real-time and online transaction processing databases to generate combined and normalized data, remove outliers from the combined and normalized data, convert the combined data to time series data, and build a predictive model using an autoregressive integrated moving average for the at least one well that predicts when the at least one well will be producing hydrocarbons with water content greater than one percent based on the converted data, and identify whether the at least one well should be further tested for water and determining when the well will change from dry to wet based on the predictive model.

According to an embodiment, the system can be configured wherein the computer system uses machine learning to compare and correlate the historical online transaction processing data and the real-time data from each of the online transaction processing database and real-time database, respectively.

According to an embodiment, the system can be configured wherein data from each of the online transaction processing database and the real-time database is updated and the updated data is used to build a predictive model based off the data changes from each database.

According to an embodiment, the system can be configured wherein the computer system is further configured to gather the readings in real time and log the readings to the real-time database, the sensor readings being generated by meters installed at the surface, on the wellhead, and inside the well head at the main or mother bore of the wells relating to flow rate of the fluid, the different phases of fluid, the temperature, the pressure, and vibrations of mechanical devices.

According to an embodiment, the system can be configured wherein the real-time database is monitored and analyzed and configured to raise a flag if a well goes offline unexpectedly or if it is under-producing.

According to an embodiment, the system can be configured wherein the online transaction processing database includes information about wells, their age, the production history, type of completion, and various geochemical tests conducted in fluid samples taken from the wells.

According to an embodiment, the system can be configured wherein the computer system is further configured to analyze the real-time data to identify patterns in the data and further configured to process the data to smooth out noise and disqualify bad signals.

According to an embodiment, the system can be configured wherein the computer system is further configured to schedule geochemical testing according to an automatic decision based on the predictive model generated.

According to an embodiment, the system can be configured wherein the computer system is further configured to display to a user on a display the status of each well, the information gathered in the real-time and online transaction processing databases, and the predictive models.

BRIEF DESCRIPTION OF DRAWINGS

The foregoing aspects, features, and advantages of embodiments of the present disclosure will further be appreciated when considered with reference to the following description of embodiments and accompanying drawings. In describing embodiments of the disclosure illustrated in the appended drawings, specific terminology will be used for the sake of clarity. However, the disclosure is not intended to be limited to the specific terms used, and it is to be understood that each specific term includes equivalents that operate in a similar manner to accomplish a similar purpose.

DETAILED DESCRIPTION

Figure 1:
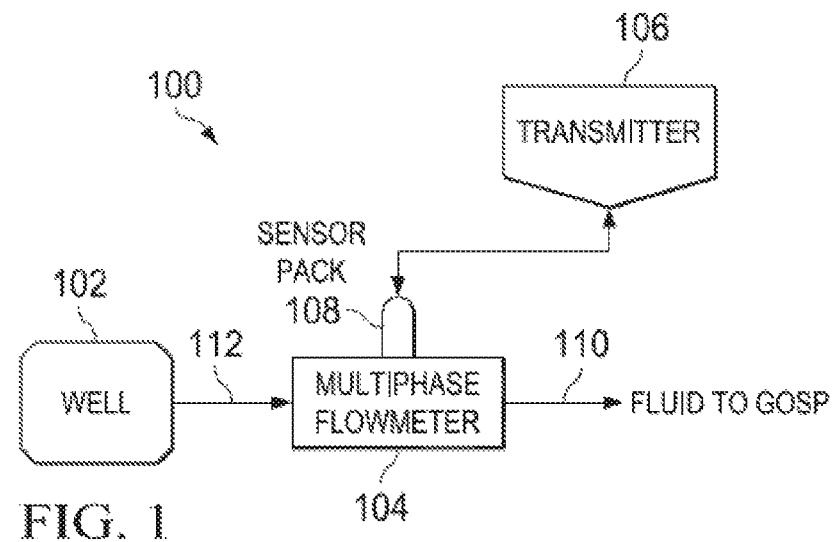
FIG. 1 illustrates a block diagram of a well configured with a multiphase flow-meter, sensor pack, and transmitter according to an embodiment.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention Like reference numerals refer to like elements throughout the specification.

Hereinafter, various embodiments will be described in detail with reference to the accompanying drawings.

In an embodiment, a system is configured to take data from a real-time database as a set of input data and also data that is stored in a conventional (OLTP) database as a second set of input data. The data from each database is then combined and normalized, outliers are removed, and then the refined data is used to predict when a dry oil producing well is expected to transition to a wet oil producing well. The holistic analysis looks at both data sets, removes outliers from the data sets, converts the data sets into a time series, and from this information a well model is made. In an embodiment, the data can be normalized because it is collected at different frequencies and a prediction is made after looking at the data from both database sources. The OLTP database collects data relating to a well's location, status, age, type of fluid produced, configuration, and contact with a reservoir. The real-time database is optimized for handling streaming data receiving data from digitized oilfield wells fitted with sensors constantly sending data. The sensors can collect and convey various types of data including data related to the flow rate of the fluid, the different phases of the fluids, such as oil, gas, or water, the temperature of the fluids, the pressure, the vibrations of mechanical devices connected to the well, and other readings as well. Various embodiments of this predictive system seek to meet the need to manage well data and make decisions based on a holistic view of a particular well by bringing disparate datasets together and making comparisons between the data collected.

The conventional database, such as an OLTP database, also collects historical data regarding a large number of wells in a particular region. This historical data and flags contained in datasets that indicate when a dry oil producing well transitions to a wet oil producing well can be useful. In an embodiment, trends for real-time data being collected on a dry oil producing well can be compared to historical trends and correlated to wells having similar data patterns for wells that have transitioned in the past from dry oil producing wells to wet oil producing wells. A well that transitions from dry to wet generally is taken to mean a well that has transitioned from producing less than one-percent of water to greater than one-percent water. In an embodiment, a different conversion point may be considered. By comparing the historical trends between data values, such as flow rate and water content percentages, and particularly for similarly situated wells in similar geographic regions, accurate predictions can be made about when a particular well will transition into a wet oil producing well. By knowing of the likely transition in advance, well managers and operators can make sure they have the appropriate equipment onsite in advance of the transition and also generate more accurate financial models regarding a particular well.

In certain embodiments, machine learning algorithms can be used to build predictive models that combine both the streaming data and the historical data. This information is used to predict when a dry well will become a wet well. In some embodiments, a dry well is declared after crude samples are collected for three consecutive samplings during well testing and the well shows a water cut greater than one-percent. The well is converted to wet at that point and treated differently by the system. For example, once a well is categorized as "wet," an engineer must then formulate a strategy on how to manage produced water. Separating systems may be configured at a well site and the produce water can then either be re-injected into the well, pumped and injected into a nearby well, or transported offsite for disposal or injection elsewhere. Additionally, the rate of production for a "wet" well must often be reduced to ensure that water does not break through and disrupt the production of oil for a particular well. Some example algorithms are described below, which use machine learning and consideration of the two databases with the goal of identifying dry wells approaching high water cut before they become wet. Several factors are used to determine when a well is predicted to transition from a dry oil producing well to a wet oil producing well. These factors can include change in fluid temperature, change in the pressure, increase of water rate, and decrease of oil rate. Depending on the configuration of a particular wellsite and what monitoring sensors may be set up, other factors can also be considered.

In another embodiment, the system first obtains the data from wells related to water cut from the OLTP and real-time databases. The data sets are then combined, but the readings in each data set are taken at different time intervals, so they are then normalized to a set time frequency. Outliers are also removed and the data points are converted to a specific time series. This provides a model based off the combined data and this model is used to predict when a dry well will become wet.

In an embodiment, a wet well prediction system first creates an open database connectivity source name and then retrieves water cut information from the real-time database for a specific set of dates. The software then retrieves the historic data from the online transaction processing database. In various embodiments, the data is then combined and outliers are removed that are outside two standard deviations. The data set is then converted to time series and is looked at for a set time period. In an embodiment, an autoregressive integrated moving average equation may be used with the time series of data using the equation:

$$\left(1 - \sum_{i=1}^{p} \phi_i L^i\right)(1-L)^d X_t = \delta + \left(1 + \sum_{i=1}^{q} \theta_i L^i\right)\varepsilon_t$$

where Xt is the time series data, t is an integer index and the series of data are real numbers. The model is given by the above equation, further with L as the lag operator, $\theta_i$ are the parameters of the moving average part and $\varepsilon_t$ are the error terms.

FIG. 1 illustrates a block diagram of a well configured with a multiphase flow-meter, sensor pack, and transmitter according to an embodiment. In an embodiment, a wellsite 100 with at least one well 102 is fitted with a sensor pack 108 that can include a multiphase flow meter 104 which measures the fluid in real-time and transmits the data to the real-time database. The multiphase flow meter 104 is part of the sensor pack 108. The fluid flows from the well 102, through a pipe 112 that is configured with the flow meter 104 and on to production facilities through pipeline 110. The sensor pack has at least one transmitter 106 which transmits the information to a computer system such that the data can be loaded into a database. The computer system and database are further configured such that the user may view the sensor data in real-time with a display or may generate and run programs against the data to aid in the analysis of the data.

In an embodiment, a display on the user's computer can display various sensor measurements including, but not limited to, water cut information, historical trends, and predictive information relating to future events. Further, the wellsite may include multiple wells, and some wells may be injected with recovery fluid for the purpose of fracturing the well to access more hydrocarbons. The layout of the wells can be such that they maximize the production of hydrocarbons and the historical and real-time data that is gathered for all the wells at and around the well-site can be combined and displayed to the user to predict when each well will become wet or dry. In an embodiment, all or only a portion of the wells at a wellsite can be tied together into a main production flow line (not shown) and the multiphase flowmeter 104 can be connected to this main production flow line.

Secondary recovery fluid can be pumped into the wells under pressure by way of pipes that are also incorporated into the flow line. Further, the number of wells can be varied based on the well site and multiple well sites can be connected together and joined through a production flow line. Each well can have one or more multiphase flowmeters 104 for measuring sensor data associated with the production of the well. A multiphase flowmeter 104 can measure the amount and volume of the flow through the pipeline by the well. It also can measure the mixture of the various components in the flow such as oil and gas. Other devices with sensors can be installed at each well such as natural gas flow meters, water flow meters, pressure meters, voltage measuring devices and other measurement devices. Measurement devices can be configured to measure the different phases of the fluids, such as oil, gas, or water, the temperature of the fluids, the pressure, the vibrations of mechanical devices connected to the well, and other readings.

The computer, computer system, and/or server system that processes all of this data from the flow meters 104 and other sensors (not shown) includes a computer readable medium and a processor where instructions can be executed through the use of a computer program. The computer program can be configured to use various algorithms that take in the sensor data and to predict future events such as well the well is predicted to turn from a dry oil producing well to a wet oil producing well. Alternatively, the prediction may also indicate that a dry oil producing well will remain a dry oil producing well for a particular duration of time. In some instances the computer system is a server system located on or near the well site, in other instances it may be located far away from the well site. The computer can also be a cloud computing system or another known computing system configuration.

Figure 2:
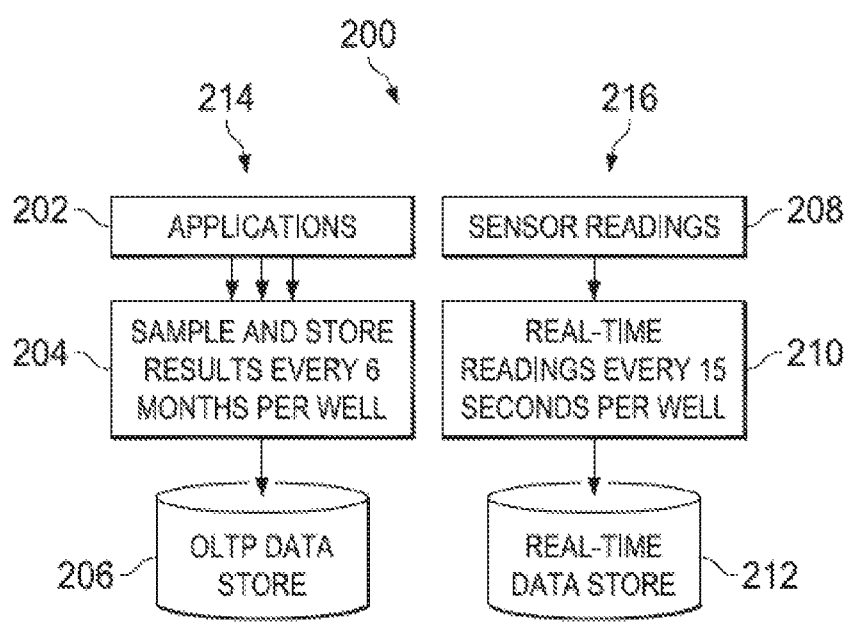
FIG. 2 illustrates a block diagram showing one possible configuration showing the data collection flow path for two distinct databases collecting well measurement information according to an embodiment.

FIG. 2 illustrates a block diagram showing one possible configuration of the data collection flow path for two distinct databases collecting well measurement information according to an embodiment. Traditional methods and systems 200 are shown and separately generate their own data stores. In one particular data gathering method 214, applications 202 communicate with the sensors 204 that store and sample particular data every 6 months in a database that is an OLTP database 206. In another particular data gathering method 216, sensor readings 208 are taken by sensors 210 every 15 seconds per well and stored in a real-time data store 212. In an embodiment, well testing data is stored in an OLTP database and in case of either missing real-time rates data or the unavailability of flow rate sensors such that data has not been gathered and stores in the real-time data store, OLTP data may be used to substitute input into the formulas to estimate production flow rates. OLTP data can be used by either interpolating or extrapolating the pressure data versus flow rate using the PQ Curve formula and method. This can be highly beneficial in the case of missing real-time data as this data can be intelligently estimated and the process of predicting a wet oil well can still be completed by utilizing OLTP data.

Figure 3:
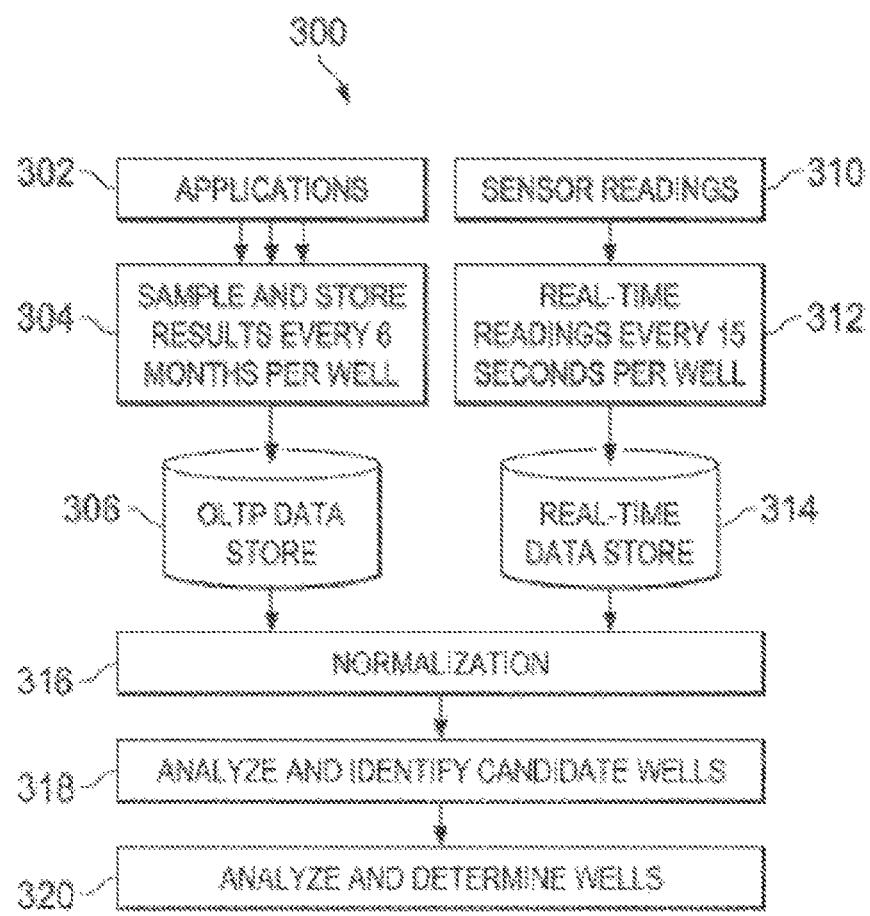
FIG. 3 illustrates a block diagram showing one embodiment of the data collection flow path of the wet well prediction system described herein.

FIG. 3 illustrates an embodiment of the wet well prediction system described herein. In an embodiment, this system combines and normalizes the data from two different databases and predicts when a dry oil producing well is expected to transition to a wet oil producing well. Applications 302 sample and store sensor readings 304 every 6 months at each well a particular application is configured to run at, and stores the data in an OLTP database 306. On the other side of the system, the sensor readings of various wells 310 are gathered in real time every 15 seconds per well by sensors 312 and stored in a real-time data store 314. Often times, the flowmeter sensors that measure oil, water, and gas rates are the most relevant sensor readings used to predict wet well transition. For cases where flowmeter sensors are not configured or may be malfunctioning, the pressure sensors become the second most relevant. For example, pressure can be used by using the PQ Curve formula to estimate the water flow rate. Of note, these are just example sensor reading and storage cycles and other time intervals may be substituted. This data along with the OLTP data is then combined and normalized 310 and then analyzed to identify candidate wells 318 that are likely to transition to wet oil producing wells. In an embodiment, the readings can be taken from a surface sensor and the water cut can be estimated using a PQ curve method. The PQ Curve is a pressure vs. rate correlation which can indicate the presence of water. The PQ Curve method is well known in the art and often used by production engineers to calculate the flow rate using pressure data. This is useful when a well is not equipped with flow rate sensors but is equipped with pressure sensors. This method uses a linear equation when the pressure reading is above the bubble point and uses Vogel's equation when the pressure reading is below the bubble point. The wells identified as likely to transition to wet oil producing wells are then predicted 320 to become wet oil producing wells at a specified time based off information from the two databases in conjunction with a computer that executes code to process the data in accordance with an autoregressive integrated moving average equation. The data may then be accessed and displayed to an end-user.

In an embodiment, a numerical modeling program stored on a computer can take into account a variety of sensor data in determining future hydrocarbon activity and the status of each well. Different pieces of information can be gathered including current hydrocarbon production rate, wellhead pressure, and other information regarding the status of each well. This information can be wirelessly transmitted or can be sent through a wired network in real time.

Based on real-time data, embodiments of the system described herein can also predict future parameters for each well and its hydrocarbon production. These parameters can include the precise time when the well will switch from a dry to a wet well. Further, users of the system can adjust certain parameters to change the timing of various events related to the well. In addition, different confidence intervals can be assigned to each prediction and various graphs can be generated to show the predicted output of each well over time.

Measurements that might be used to estimate various predictive parameters are the flow meter sensors that measure oil, water and gas rates are the most relevant sensor readings used to predict wet well transition. In the case of absent flow meter sensors, the pressure sensors become the second most relevant and may be used as discussed previously.

From the description provided above, numerous different embodiments of the invention including software are envisioned that can be combined with general purpose hardware. A computer system can be created with various components to carry out the methods of the various embodiments including a non-transitory computer readable medium that can contain instructions for a software program to implement the method of the embodiments.

The above disclosure is meant to be illustrative of the various embodiments of the present invention. Various modifications will become apparent to those skilled in the art once the disclosure is considered as a whole.

The invention claimed is:

1. A method for predicting when a dry oil producing well is expected to transition to a wet oil producing well, the method comprising:
gathering and storing real-time data from at least one well relating to water cut and storing it in real-time in a database configured to store real-time data;
gathering and storing historical online transaction processing data from the at least one well and storing the historical online transaction processing data in an online transaction processing database;
combining and normalizing the real-time data and the historical online transaction processing data from both databases;
removing outliers from the combined and normalized data;
converting the combined data to time series data;
building a predictive model using an autoregressive integrated moving average for the at least one well that predicts when the at least one well will be producing hydrocarbons with water content greater than one percent based on the converted data; and
identifying whether the at least one well should be further tested for water and determining when the well will change from dry to wet based on the predictive model.

2. The method of claim 1, further comprising:
comparing and correlating the historical online transaction processing data and the real-time data from each of the online transaction processing database and real-time database, respectively, using machine learning.

3. The method of claim 1, further comprising:
detecting data updates in each of the online transaction processing database and real-time database and building a predictive model based off these data updates.

4. The method of claim 3, further comprising:
scheduling geochemical testing according to an automatic decision based on the predictive model generated.

5. The method of claim 3, further comprising:
displaying to a user on a display a status of each well and the predictive models.

6. The method of claim 1, further comprising:
taking readings in real time at meters installed at a surface, on a wellhead, and inside the well head at a main or mother bore of the wells relating to flow rate of a fluid, different phases of fluid, temperature, pressure, and vibrations of mechanical devices.

7. The method of claim 1, further comprising:
monitoring the real-time data database and raising a flag if a well goes offline unexpectedly or if it is underproducing.

8. The method of claim 1, wherein the online transaction processing database includes database fields for information about wells, their age, production history, type of completion, and various geochemical tests conducted in fluid samples taken from the wells.

9. The method of claim 1, further comprising:
analyzing and processing data in the real-time database to identify patterns in the real-time data and processing data in the real-time database to smooth out noise and disqualify bad signals.

10. A system for predicting when a dry oil producing well is expected to transition to a wet oil producing well, the system comprising:
a real-time database configured to store real-time data from at least one well relating to water cut;
an online transaction processing database configured to gather and store historical data from the at least one well;
a computer system configured with a processor and memory, the computer configured to combine and normalize data from the real-time and online transaction processing databases to generate combined and normalized data, remove outliers from the combined and normalized data, convert the combined data to time series data, and build a predictive model using an autoregressive integrated moving average for the at least one well that predicts when the at least one well will be producing hydrocarbons with water content greater than one percent based on the converted data, and identify whether the at least one well should be further tested for water and determining when the well will change from dry to wet based on the predictive model.

11. The system of claim 10, wherein the computer system uses machine learning to compare and correlate the historical online transaction processing data and the real-time data from each of the online transaction processing database and real-time database, respectively.

12. The system of claim 10, wherein data from each of the online transaction processing database and the real-time database is updated and the updated data is used to build a predictive model based off the data changes from each database.

13. The system of claim 10, wherein the computer system is further configured to gather sensor readings in real time and log the sensor readings to the real-time database, the sensor readings being generated by meters installed at a surface, on a wellhead, and inside the well head at a main or mother bore of the wells relating to flow rate of a fluid, different phases of fluid, temperature, pressure, and vibrations of mechanical devices.

14. The system of claim 10, wherein the real-time database is monitored and analyzed and configured to raise a flag if a well goes offline unexpectedly or if it is under-producing.

15. The system of claim 10, wherein the online transaction processing database includes information about wells, their age, production history, type of completion, and various geochemical tests conducted in fluid samples taken from the wells.

16. The system of claim 10, wherein the computer system is further configured to analyze the real-time data to identify patterns in the real-time data and further configured to process the data to smooth out noise and disqualify bad signals.

17. The system of claim 10, wherein the computer system is further configured to schedule geochemical testing according to an automatic decision based on the predictive model generated.

18. The system of claim 10, wherein the computer system is further configured to display to a user on a display a status of each well, information gathered in real-time and online transaction processing databases, and the predictive models.

* * * * *